United States Patent
Chen et al.

(10) Patent No.: US 7,151,660 B2
(45) Date of Patent: *Dec. 19, 2006

(54) HIGH DENSITY MAZE CAPACITOR

(75) Inventors: Henry KuoShun Chen, Irvine, CA (US); Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/324,221

(22) Filed: Jan. 4, 2006

(65) Prior Publication Data

US 2006/0203424 A1    Sep. 14, 2006

Related U.S. Application Data

(63) Continuation of application No. 11/078,511, filed on Mar. 14, 2005, now Pat. No. 7,009,832.

(51) Int. Cl.
*H01G 4/228* (2006.01)

(52) U.S. Cl. .................. 361/306.1; 361/309; 361/329; 257/306; 257/310; 29/25.41

(58) Field of Classification Search ............. 361/306.1, 361/303, 306.3, 328–329; 257/303, 306, 257/309–310, 532, 534; 29/25.41, 25.42
See application file for complete search history.

(56) References Cited

U.S. PATENT DOCUMENTS 5,583,359 A * 12/1996 Ng et al. .................... 257/306

6,653,681 B1 * 11/2003 Appel ......................... 257/307
6,690,570 B1 * 2/2004 Hajimiri et al. ......... 361/306.1
2003/0206389 A1 * 11/2003 Hajimiri et al. ......... 361/306.1
2004/0031982 A1 * 2/2004 Devries et al. ............. 257/307

OTHER PUBLICATIONS

Roberto Aparicio, *Student Member, IEEE*, and Ali Hajimiri, *Member, IEEE*; Capacity Limits and Matching Properties of Integrated Capacitors; IEEE Journal of Solid-State Circuits, pp. 384-393, vol. 37, No. 3, Mar. 2002.
Hirad Samavati, *Student Member, IEEE*, Ali Hajimiri, Arvin R. Shahani, Gitty N. Nasserbakht, and Thomas H. Lee, *Member, IEEE*; Fractal Capacitors; IEEE Journal of Solid-State Circuits, pp. 2035-2041, vol. 33, No. 12, Dec. 1998.
Jay Rajagopalan and Haris Basit; Optimization of Metal-Metal Comb-Capacitors for RF Applications, 4 pages, 2001.
Tirdad Sowlati, Vickram Vathulya and Domine Leenaerts; High Density Capacitance Structures in Submicron CMOS for Lower Power RF Applications, *ISLPED* '01, Aug. 6-7, 2001, pp. 243-246.

* cited by examiner

*Primary Examiner*—Eric W. Thomas
(74) *Attorney, Agent, or Firm*—Sterne, Kessler, Goldstein & Fox P.L.L.C.

(57) ABSTRACT

A capacitor including a first and second component capacitor structure disposed on a substrate. A component capacitor structure includes a first arm, a second arm, and a via. The first arm has a first end and a second end. The second arm has a third end and a fourth end. The first arm and the second arm intersect and the first, second, third and fourth ends all extend in the same rotary direction. The via is electrically coupled to an area of intersection of the first and second arms.

15 Claims, 12 Drawing Sheets

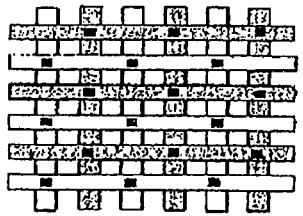
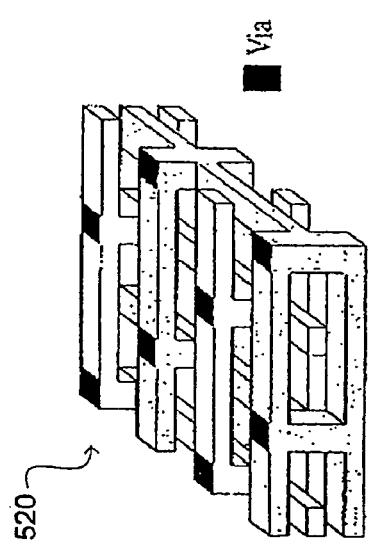
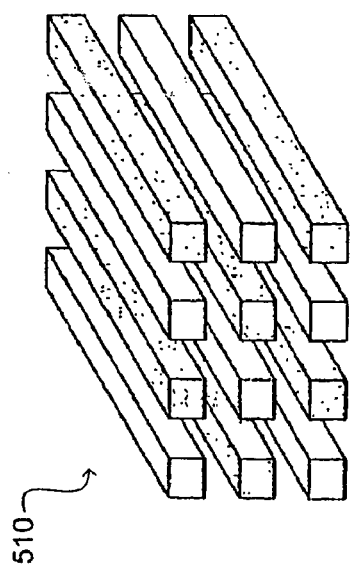
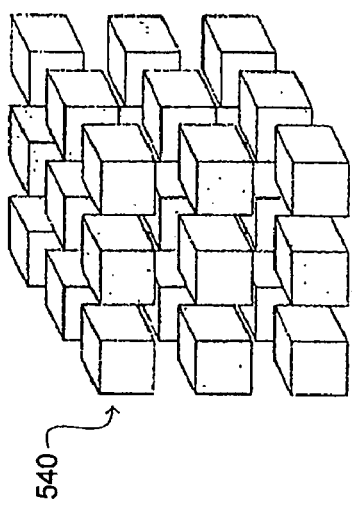
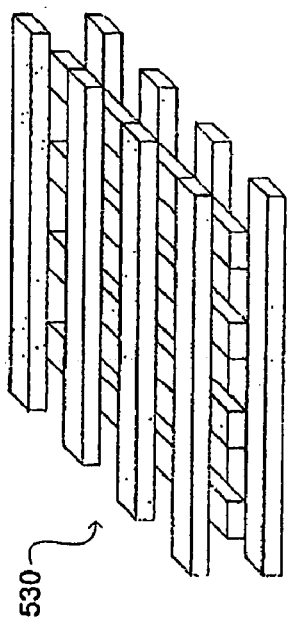
FIG. 5A
FIG. 5B
FIG. 5C
FIG. 5D
Prior Art

HIGH DENSITY MAZE CAPACITOR

CROSS REFERENCE TO RELATED APPLICATIONS

This application is a continuation of U.S. patent application Ser. No. 11/078,511, entitled "A High Density Metal-to-Metal Maze Capacitor With Optimized Capacitance Matching," to Chen et al., filed on Mar. 14, 2005, now U.S. Pat. No. 7,009,832, the entirety of which is hereby incorporated by reference as if fully set forth herein.

BACKGROUND OF THE INVENTION

1. Field of the Invention

The present invention relates generally to capacitors in integrated circuits.

2. Background Art

Capacitors are fundamental component devices in many of today's communication integrated circuits (IC), including sample and hold circuits, analog to digital (A/D) converters, and radio frequency (RF) applications. Several types of capacitors are available in standard Complementary Metal Oxide Semiconductor (CMOS) logic and mixed signal technologies. Example capacitors include metal-insulator-metal (MIM) capacitors, Negative polarity Metal Oxide Semiconductor (NMOS) in Nwell MOS capacitors, Positive polarity Metal Oxide Semiconductor (PMOS) in Pwell capacitors, and metal line lateral and vertical flux capacitors.

Depending on the particular application, each capacitor type has its advantages and disadvantages in terms of performance and fabrication. For example, historically speaking, MIM capacitors could achieve greater capacitance densities compared to other types of capacitors, but during fabrication the MIM capacitors required an additional mask. More recently, since the density of metal-to-metal capacitors has become close to that of MIM capacitors, and since they do not require an additional mask, metal-to-metal capacitors are often used in RF applications.

The idea of a capacitor is simple: to store electrostatic energy between two dielectric volumes. The theoretical limitations on the capacitance that can be achieved in a capacitor is determined by the voltage difference between the two dielectric volumes and the geometric characteristics of the two dielectric volumes. Much of the effort in improving the capacitance of a capacitor used in an integrated circuit has focused on altering the geometric characteristics of the two dielectric volumes.

Several different geometrical designs for metal-to-metal capacitors have been disclosed in other publications. For example, Robert Aaricio and Ali Hajimiri, "Capacity Limits and Matching Properties of Integrated Capacitors," IEEE Journal of Solid-State Circuits, 37(3), (March 2002), present the following list of metal line capacitors that are used in communication IC applications: (i) parallel wire configuration, (ii) vertical parallel plate structure, (iii) quasi-fractal capacitor structure, (iv) vertical bar structure, and (v) Manhattan capacitor structure. In addition, Hirad Samavati et al., "Fractal Capacitors," IEEE Journal of Solid-State Circuits, 33(12), (December 1998), discuss the use of (vi) fractal capacitors. Each of these capacitor configurations is briefly described below.

FIG. 1 shows a simple geometric design for a capacitor 100, which uses parallel plates held at different biases to store electrostatic energy. For example, plate 110 can be electrically high, while plate 120 can be electrically low. While this design can be used to effectively store electrostatic charge, it consumes a larger portion of the silicon chip compared to other geometrical designs making this an inefficient and undesirable capacitor design. Variations of the parallel plate capacitor abound.

FIG. 2 shows a lateral view 210 and a top view 220 of a capacitor in the parallel wire configuration. One portion of the parallel wire capacitor is held at a high bias and another portion is held at a low bias. For example, a portion 230 can be held at an electrically high bias, whereas another portion 240 can be held at an electrically low bias. A capacitor utilizing this configuration can improve capacitance density by taking advantage of both the lateral and vertical electric field components of each of portions 230 and 240.

FIG. 3 shows a capacitor 300 in the vertical parallel plates configuration. A vertical plate 310 can be held at an electrically high bias, whereas an adjacent vertical plate 320 can be held at an electrically low bias. Vias 330 connect the vertical wire-segments to create vertical slabs, e.g., vertical plate 310 or vertical plate 320.

FIG. 4 shows a three-dimensional lateral view 410 and a top view 420 of a capacitor in the vertical bars configuration. Metal squares are vertically connected by vias 450 to create columns of capacitor terminals, e.g., capacitor terminal 430 and capacitor terminal 440.

FIGS. 5A, 5B, 5C and 5D show various Manhattan structure capacitors 510, 520, 530 and 540, respectively. As these figures show, Manhattan structure capacitors are simple variations of different rectangular-shaped structures.

FIGS. 6A, 6B and 6C show various quasi-fractal capacitor structures 610, 620 and 630, respectively, and FIG. 7 shows a fractal capacitor design 710. Fractal and quasi-fractal structures are, theoretically speaking, good candidates for capacitor designs, because fractals fill more of a two-dimensional area than a simple curve does. Hence, fractal and quasi-fractal designs can potentially lead to higher capacitance density compared to other designs. However, due to fabrication processes a true fractal capacitor cannot be realized on an integrated circuit.

Although there are several types of metal-to-metal capacitors, as technology continues to scale, designs that optimize capacitance density and capacitance matching are the most desirable. Relatively speaking, capacitors occupy a large fraction of the chip area, so as chips shrink in size an increase in capacitance density is needed. Furthermore, in order for a capacitor to achieve proper performance within a given IC, it is important that the capacitance of adjacent components be fairly accurately matched; i.e. the measured capacitance of adjacent capacitor components should be almost identical. Current capacitor designs (e.g., the capacitors discussed with reference to FIGS. 1–4, 5A, 5B, 5C, 5D, 6A, 6B, 6C and 7) are less than ideal in terms of capacitance density and matching.

Therefore, further improvements in the capacitance density and capacitance matching are needed as technology scales. In addition, since process-induced variations tend to hamper the performance of capacitors, it would be advantageous if the improvements were achieved in a manner that minimized process-induced variations.

BRIEF SUMMARY OF THE INVENTION

The present invention is directed to a capacitor that improves capacitance density and capacitance matching. In addition, the proposed capacitor minimizes process-induced variations.

An embodiment of the present invention provides a capacitor including a first and second component capacitor structure disposed on a substrate. Each component capacitor structure includes a first arm, a second arm, and a via. The first arm has a first end and a second end. The second arm has a third end and a fourth end. The first and the second arm intersect and the first, second, third and fourth ends all extend in the same rotary direction. The via is electrically coupled to an area of intersection of the first and second arms.

Another embodiment of the present invention provides a method for operating a capacitor. The capacitor includes a first and a second component capacitor structure as described in the previous paragraph. The method includes holding the via of the first component capacitor structure at a first voltage, and holding the via of the second component capacitor structure at a second voltage.

A further embodiment of the present invention provides a method for operating a capacitor. The capacitor includes a plurality of component capacitor structures as described above. The method includes holding the via of a first component capacitor structure in the plurality of component capacitor structures at a first voltage if the vias of component capacitor structures adjacent to the first component capacitor structure are held at a second voltage, and holding the via of a second component capacitor structure in the plurality of component capacitor structures at a second voltage if the vias of the component capacitor structures adjacent to the second component capacitor structure are held at the first voltage.

Further features and advantages of the present invention, as well as the structure and operation of the various embodiments of the present invention, are described in detail below with reference to the accompanying drawings. It is note that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 5A, 5B, 5C and 5D illustrate various Manhattan capacitor configurations.

The present invention will now be described with reference to the accompanying drawings. In the drawings, like reference numbers may indicate identical or functionally similar elements.

DETAILED DESCRIPTION OF THE INVENTION

The present invention provides a capacitor that improves capacitance density and capacitance matching. As will be described in more detail herein, a capacitor in accordance with an embodiment of the present invention includes at least two component capacitor structures.

Example advantages of the present invention include, but are not limited to, achieving minimum metal island area requirement while maintaining minimum metal pitch everywhere, reducing process induced variations, and advantageously using the rounding of 90-degree corners that occurs during processing.

Throughout this Detailed Description it is to be appreciated that the figures are shown for illustrative purposes only, and not limitation. For example, it is to be appreciated that a mirror-image and other such modifications to the embodiment shown in FIGS. 8–12 are contemplated as being within the scope of the present invention. For the sake of clarity, the description of the figures tracks the embodiments shown. However, appropriate changes to the disclosed embodiments, to cover alternate embodiments not described herein, will become apparent to a person skilled in the art upon reading and understanding this disclosure.

Exemplary Component Capacitor Structure

Figure 1:
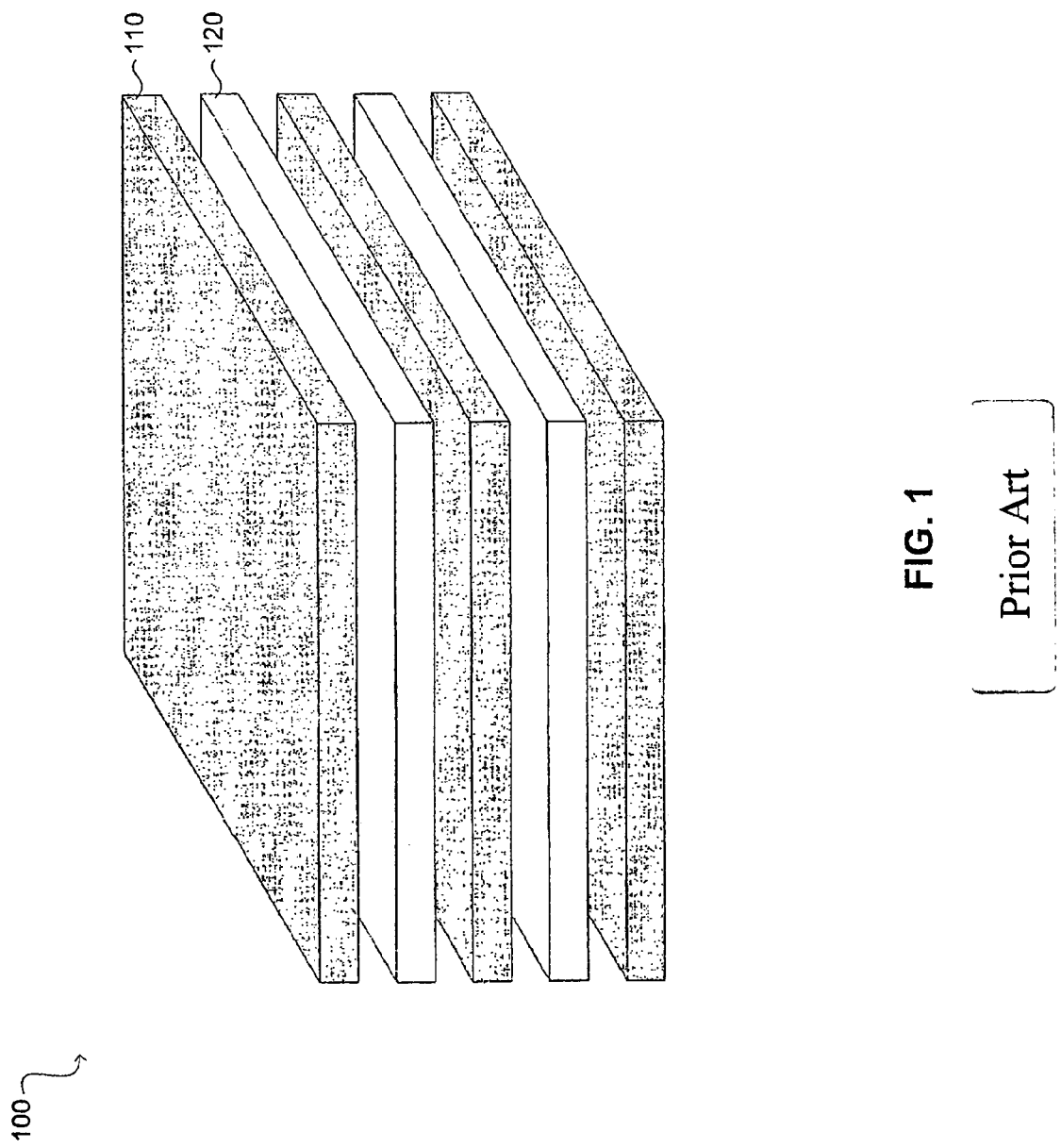
FIG. 1 is a depiction of a parallel plate capacitor.
Figure 2:
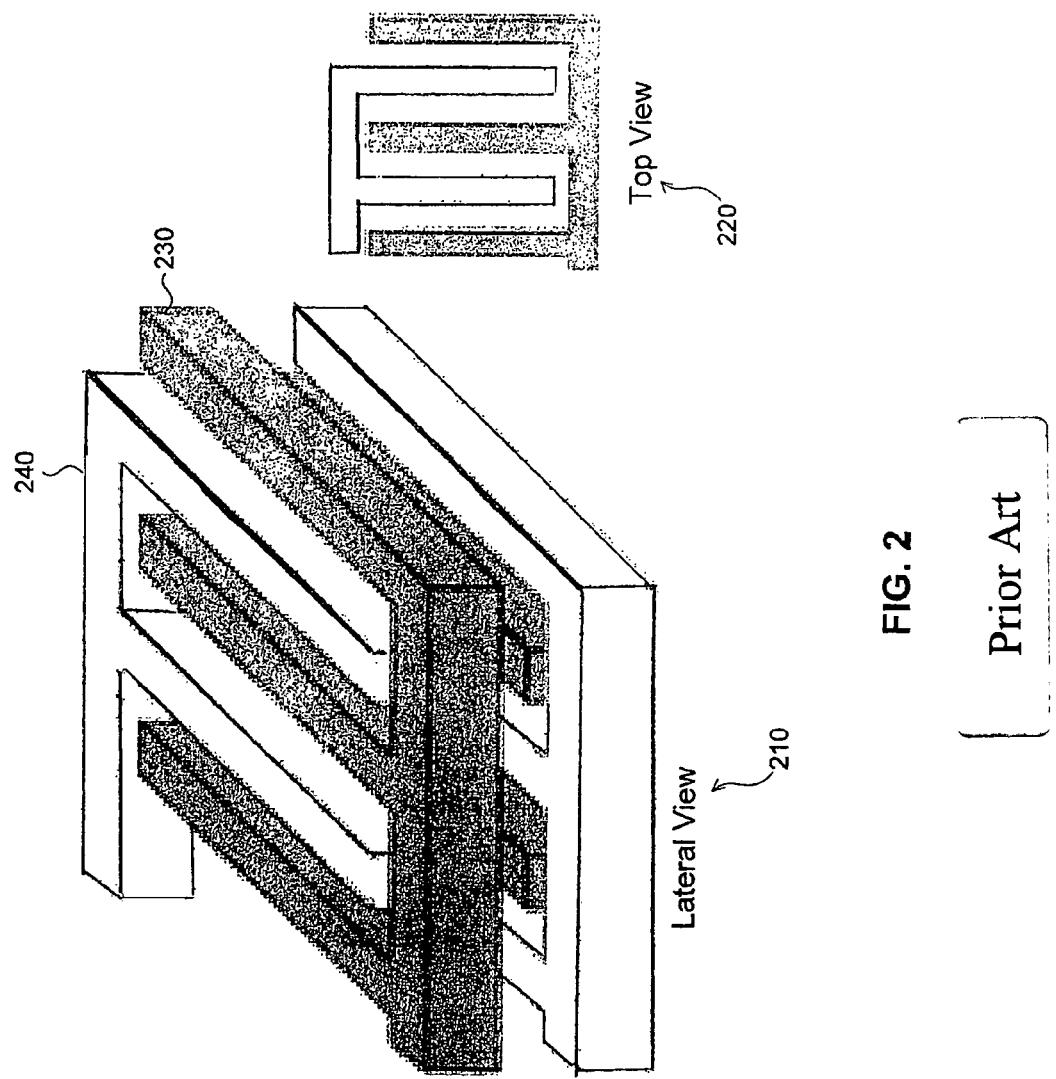
FIG. 2 is a depiction of a capacitor in the parallel wire configuration.
Figure 3:
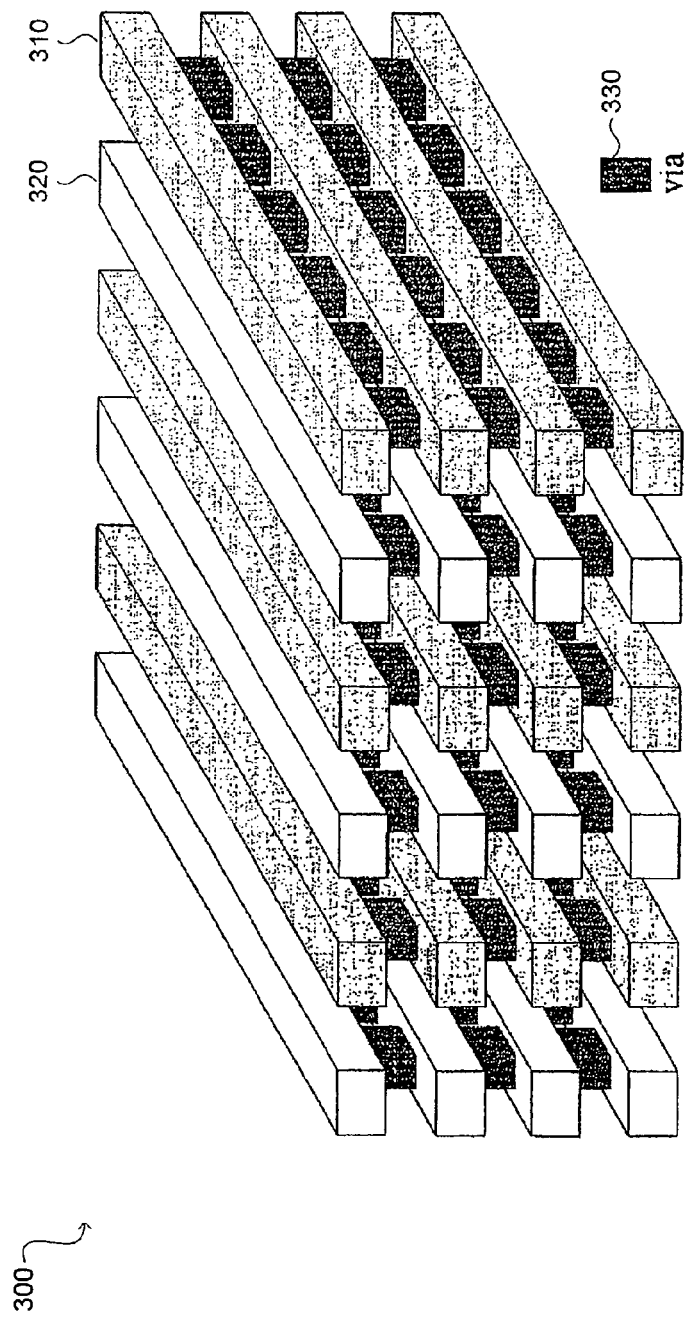
FIG. 3 is a depiction of a capacitor in the vertical parallel plate configuration.
Figure 4:
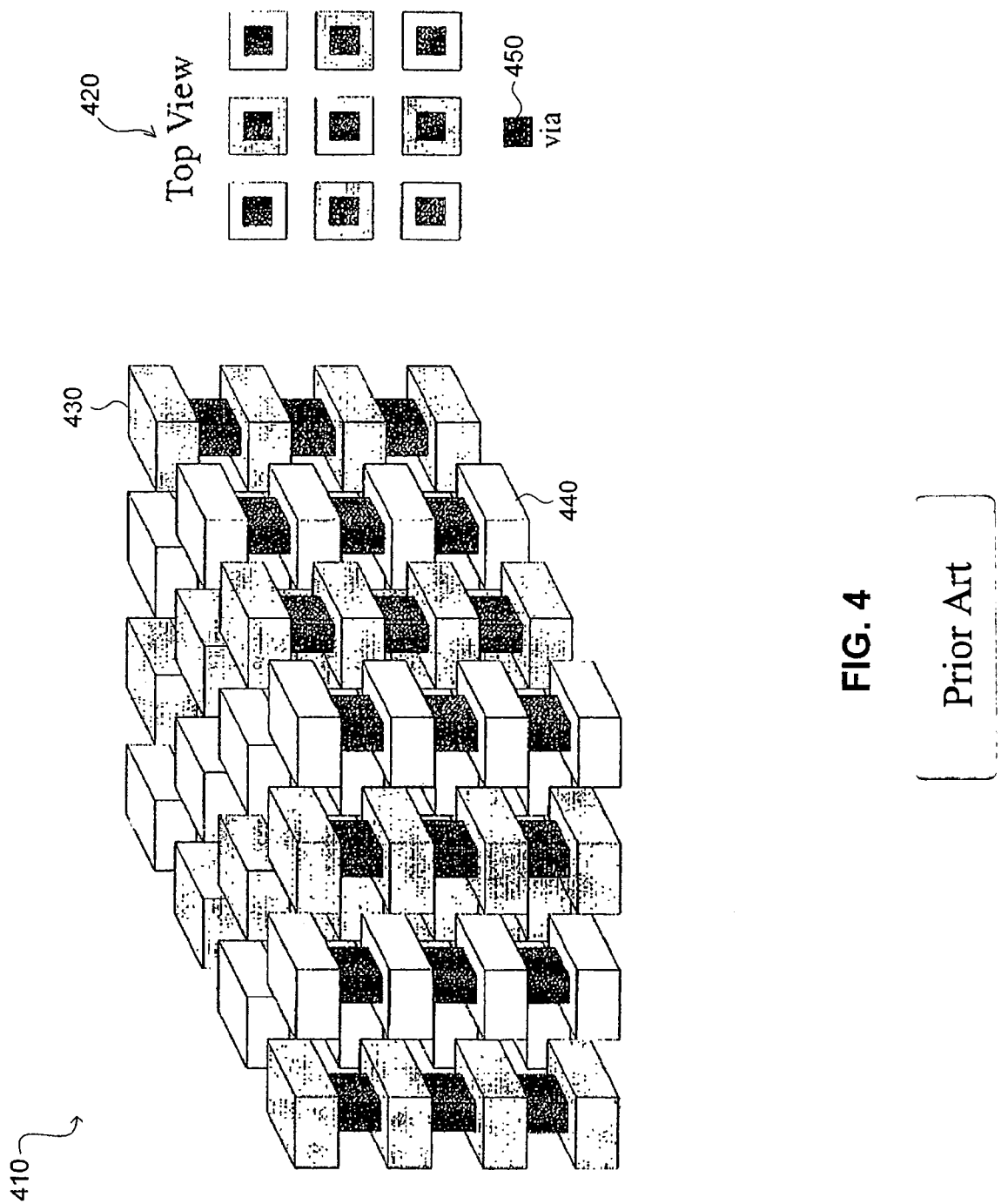
FIG. 4 is a depiction of a capacitor in the vertical bar configuration.
Figure 6A:
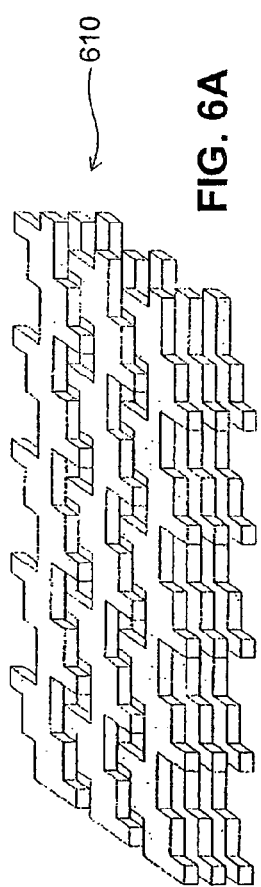
FIGS. 6A, 6B and 6C illustrate various quasi-fractal capacitor configurations.
Figure 6B:
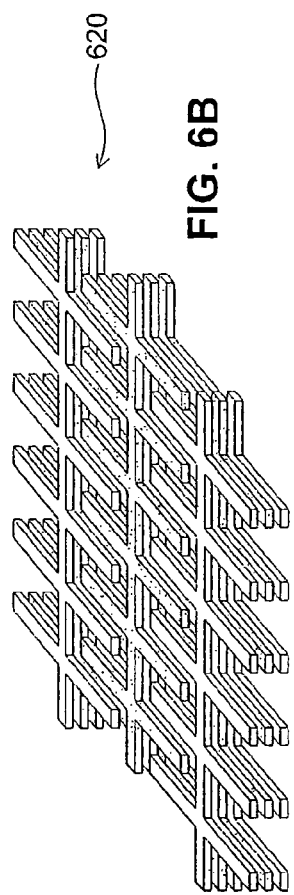
Figure 6C:
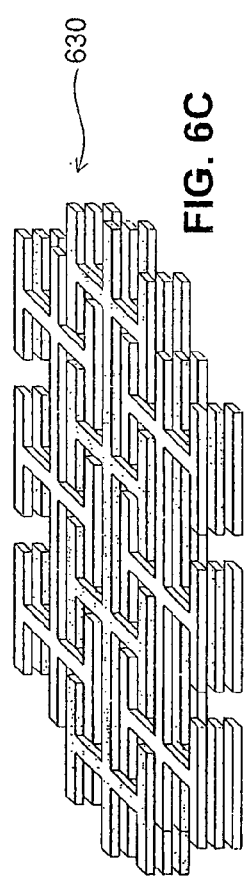
Figure 7:
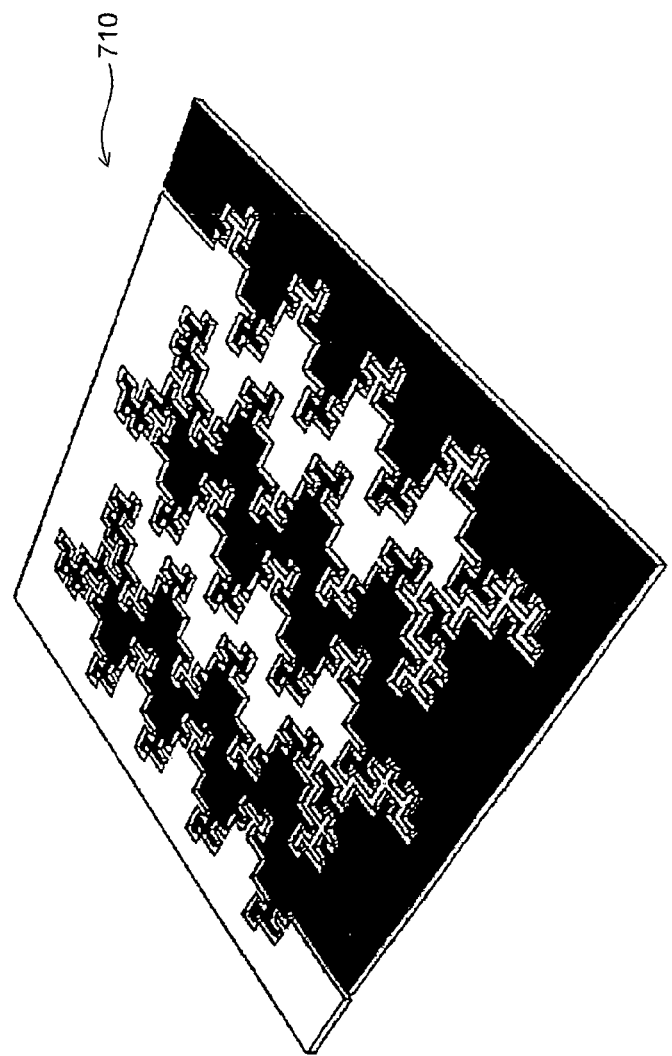
FIG. 7 is a schematic depiction of a fractal capacitor configuration.
Figure 8:
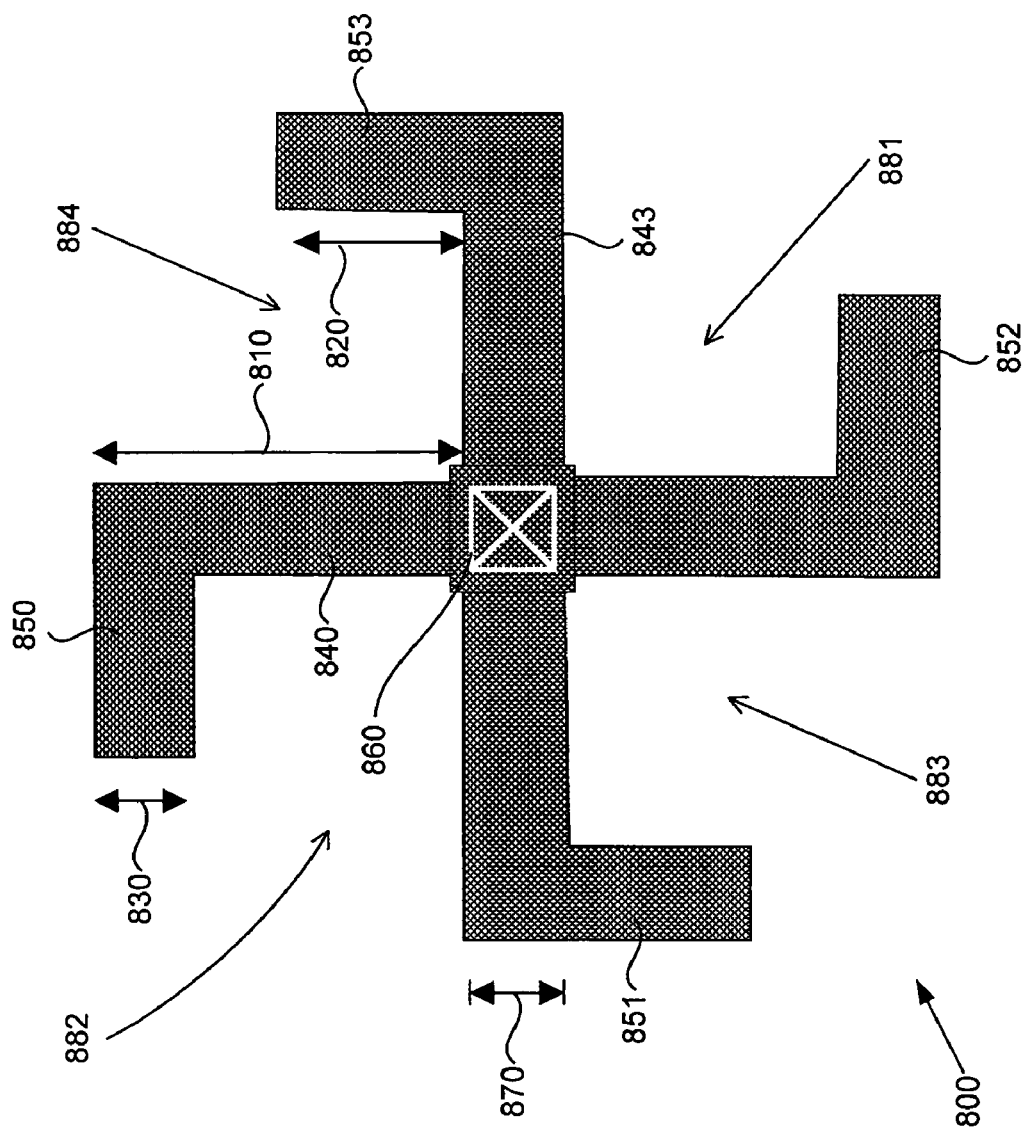
FIG. 8 depicts an exemplary component capacitor structure in accordance with an embodiment of the present invention.

FIG. 8 shows a top view of a component capacitor structure 800 in accordance with an embodiment of the present invention. Component capacitor structure 800 includes an upright arm 840, a transverse arm 843, and a via 860. Upright arm 840 includes a top end 850 and a bottom end 852 that extend at substantially right angles to a central axis of upright arm 840. Similarly, transverse arm 843 includes a left end 851 and a right end 853 that extend at substantially right angles to a central axis of transverse arm 843. As seen in FIG. 8, top end 850, bottom end 852, left end 851, and right end 853 all extend in the same rotary direction.

Via 860 is located at an area of intersection of upright arm 840 and transverse arm 843. In addition, via 860 is electrically coupled to upright arm 840 and transverse arm 843. For example, each of upright arm 840, transverse arm 843, and via 860 can be made of an electrically conductive material, e.g., a metal. The electrically conductive material can be, but need not be, the same for upright arm 840, transverse arm 843, and via 860.

In an example, each of top end 850, bottom end 852, left end 851, and right end 853 has a first length 820. Each portion of upright arm 840 and transverse arm 843 that extends from the area of intersection has a second length 810. In another example, a width of upright arm 840 is substantially equal to a width of transverse arm 843; for simplicity, this width is denoted as width 830. In an example, width 830 is minimized according to constraints known to a person skilled in metal on a substrate. (A few of these constraints are mentioned in more detail below.) In such an example, width 830 may herein be referred to as the "minimum metal width."

Example Capacitor With Two Component Capacitor Structures

Figure 9:
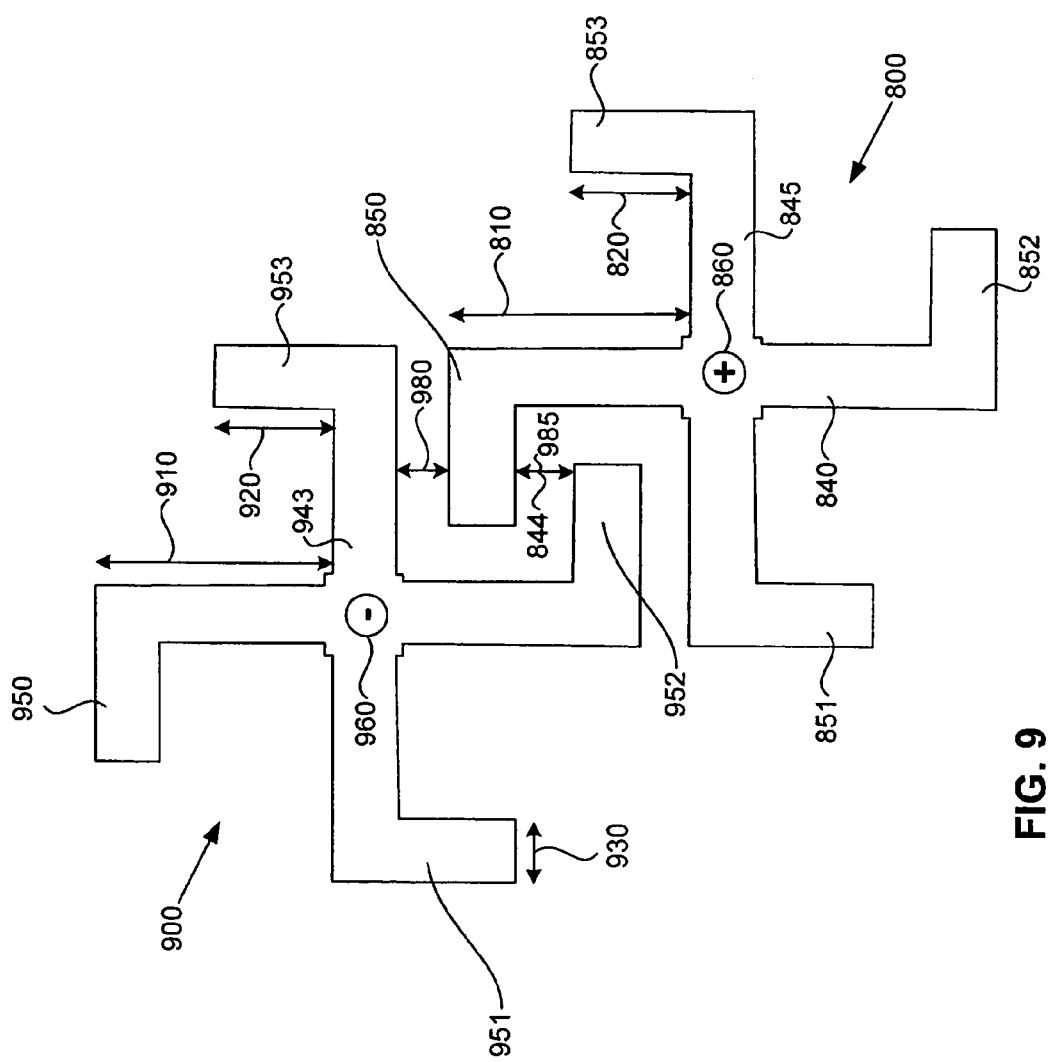
FIG. 9 illustrates two component capacitor structures oriented to form a capacitor in accordance with an embodiment of the present invention.

Two component capacitor structures can be disposed in close proximity to form a capacitor. FIG. 9 shows a top view of component capacitor structure 800 disposed near another component capacitor structure 900 to form a capacitor in accordance with an embodiment of the present invention. Component capacitor structure 900 is structurally substantially identical to component capacitor structure 800. For example, component capacitor structure 900 includes the following: a width 930 that is substantially structurally identical to width 830; a first length 920 that is substantially structurally identical to first length 820 of component capacitor structure 800; and a second length 910 that is substantially structurally identical to second length 810 of component capacitor structure 800.

To form the capacitor the vias of the two component capacitor structures are held at differing bias. For example, via 860 of component capacitor structure 800 can be held at an electrically high potential compared to via 960 of component capacitor structure 900, or vice versa.

The orientation of component capacitor structure 900 in relation to component capacitor structure 800 is such that an end of component capacitor structure 900 is disposed in one of four areas defined by component capacitor structure 800. These four areas are defined below in terms of exemplary component capacitor structure 800, although it is to be appreciated that the areas below-defined pertain to all component capacitor structures in this disclosure.

Referring again to FIG. 8, component capacitor structure 800 defines a first area 881, a second area 882, a third area 883, and a fourth area 884. First area 881 is defined as the area bounded by bottom end 852 of upright arm 840 and transverse arm 843. Second area 882 is defined as the area bounded by top end 850 of upright arm 840 and transverse arm 843. Third area 883 is defined as the area bounded by left end 851 of transverse arm 843 and upright arm 840. Fourth area 884 is defined as the area bounded by right end 853 of transverse arm 843 and upright arm 840.

Figure 10:
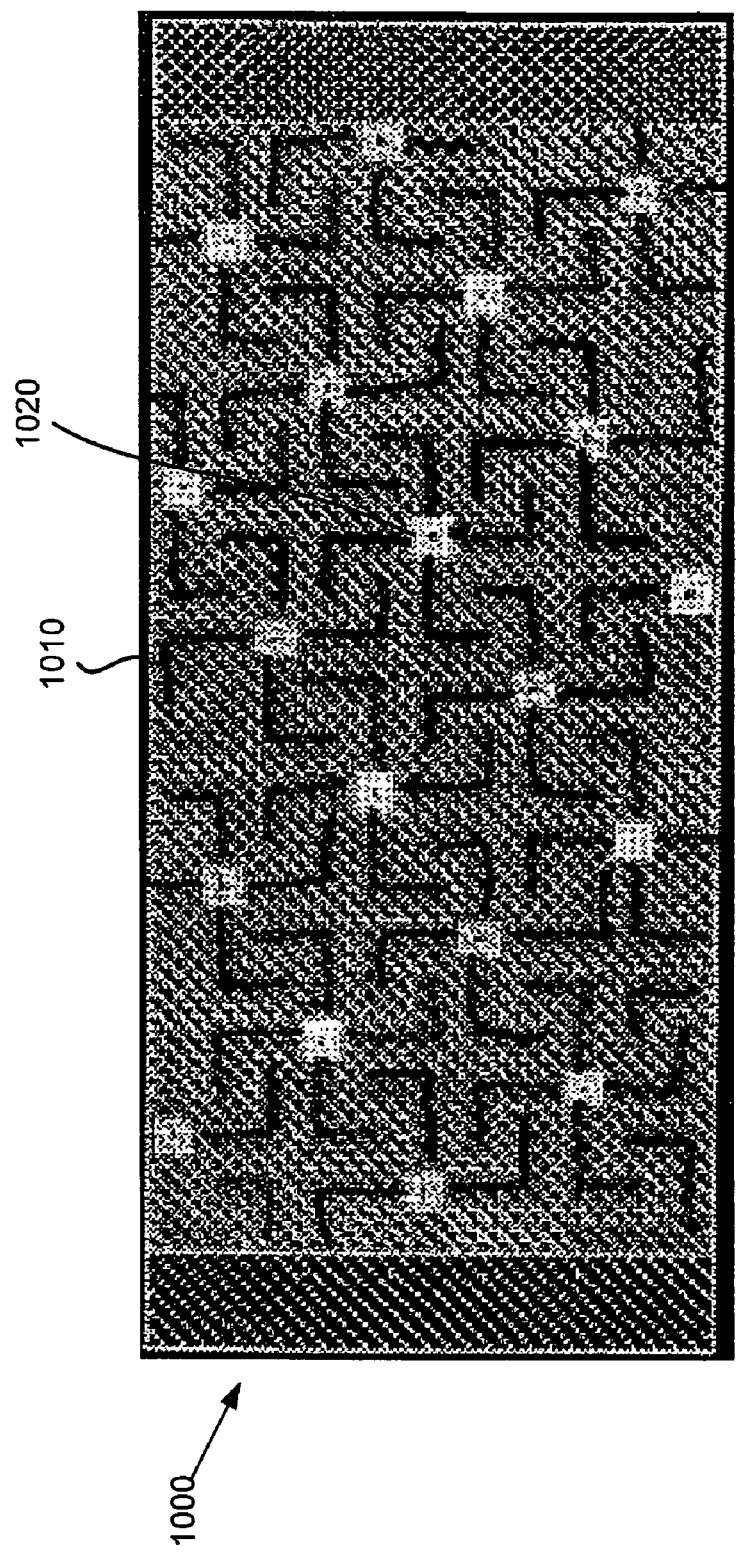
FIG. 10 illustrates a plurality of component capacitor structures disposed on a single layer of a substrate in accordance with an embodiment of the present invention.
Figure 11:
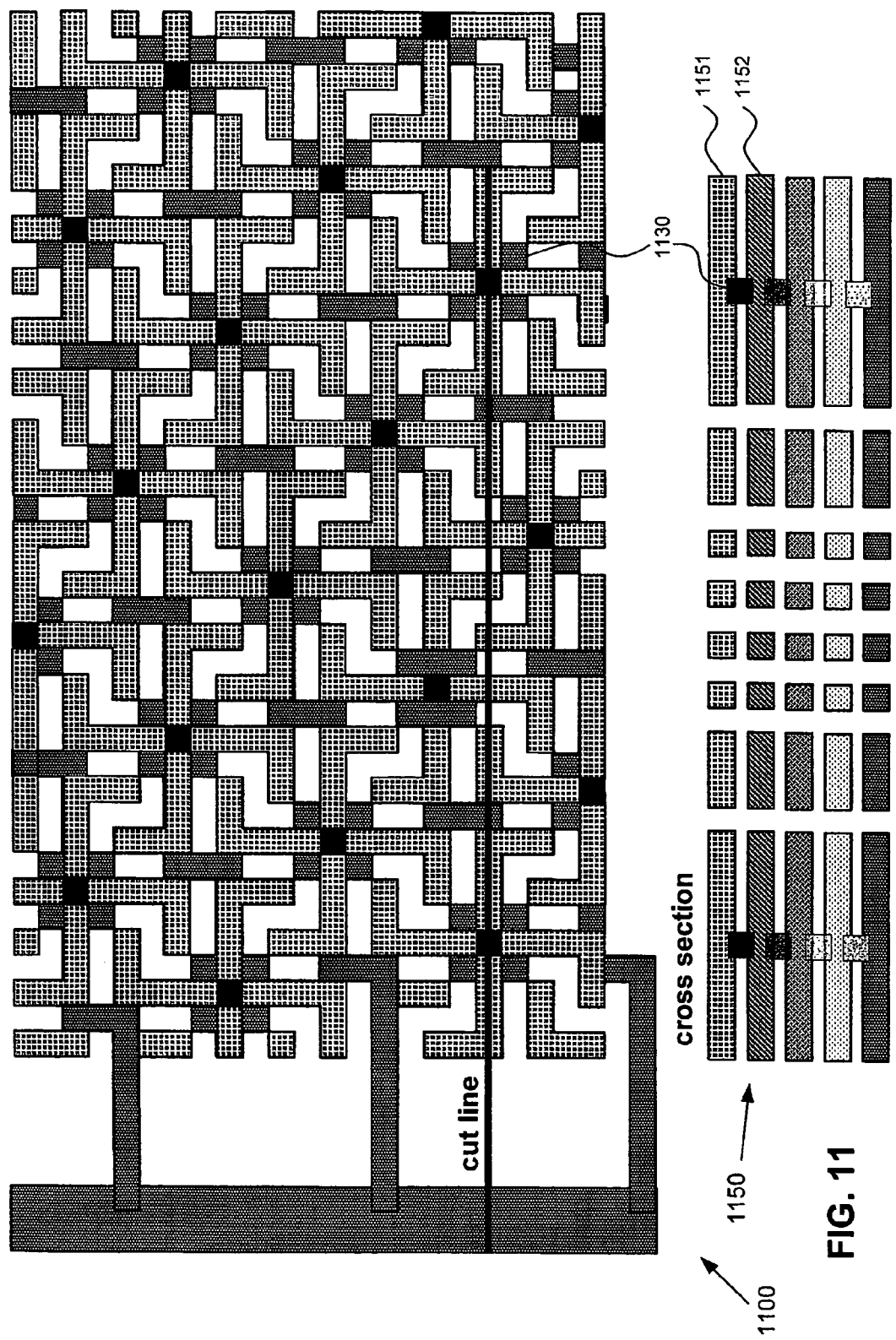
FIG. 11 illustrates a multi-layer capacitor in accordance with an embodiment of the present invention.

FIG. 9 shows bottom end 952 of component capacitor structure 900 disposed in second area 882 defined by component capacitor structure 800. It is to be appreciated that FIG. 9 is shown for illustrative purposes only, and not limitation. In particular, in a similar vein to that illustrated in FIG. 9, top end 950, left end 951, or right end 953 of component capacitor structure 900 could have been disposed in first area 881, fourth area 884, or third area 883, respectively, defined by component capacitor structure 800. It is to be appreciated that these alternative embodiments are contemplated within the scope of the present invention. (Such embodiments are shown in FIGS. 10 and 11.)

FIG. 9 depicts a spacing 980 between top end 850 of component capacitor structure 800 and transverse arm 943 of component capacitor structure 900. In addition, FIG. 9 includes a spacing 985 between top end 850 of component capacitor structure 800 and bottom end 952 of component capacitor structure 900. In an example, spacing 980 is substantially equal to spacing 985. In this example, spacing 980 and/or spacing 985 may be referred to herein as the "minimum metal spacing" or "minimum spacing."

In an example, the dimensions of the component capacitor structures and the alignment of the component capacitor structures can be such that the packing density is maximized. The packing density of the capacitor is maximized when the dimensions of the component capacitor structures adhere to the following conditions: (i) each of the lengths of the top, bottom, left, and right ends of the component capacitor structures (e.g., first length 820 of component capacitor structure 800 and first length 920 of component capacitor structure 900) is substantially equal to the sum of the minimum metal width (e.g., width 830) plus the metal spacing (e.g., spacing 980); and (ii) each of the portions of the upright and transverse arms that extend from the area of intersection of the upright and transverse arms (e.g., second length 810 of component capacitor structure 800 and second length 910 of component capacitor structure 900) is substantially equal to two times the sum of the minimum metal width plus the metal spacing. In other words, each of the portions of the upright and transverse arms that extend from the area of intersection is twice the length of each of the lengths of the top, bottom, left, and right ends of the component capacitor structures.

Furthermore, in order to maximize the packing density, the component capacitor structures must be aligned according to the following condition: the central axis of upright arm 840 of component capacitor structure 800 is substantially parallel to and in a line with the central axis of right end 953 of transverse arm 943 of component capacitor structure 900.

It is to be appreciated that the above described alignment refers to the embodiment shown in FIG. 9. However, if any of top end 950, left end 951, or right end 953 of component capacitor structure 900 were disposed in first area 881, fourth area 884, or third area 883, respectively, of component capacitor structure 800 the alignment of the two component capacitor structures would be modified accordingly. Such modifications will be apparent to a person skilled in the art based on the teachings provided herein. For brevity, these modification will not be described further.

Example Capacitor with a Plurality of Component Capacitor Structures

In an example embodiment, a plurality of component capacitor structures are disposed on a single layer of a substrate to form a capacitor, as shown in FIG. 10. To form the capacitor, adjacent component capacitor structures are held at different biases. For example, the component capacitor structure 1010 can be held at a first voltage (e.g., an electrically high bias), whereas an adjacent component capacitor structure 1020 can be held at a second voltage (e.g., an electrically low bias). Said another way, if a given component capacitor structure is held a first voltage (high or low), the component capacitor structures adjacent to the given component capacitor structure are held at a second voltage (low or high, respectively), and vice versa.

The plurality of component capacitor structures are disposed in close proximity to each other in a similar manner to that described in detail above with reference to FIG. 9. In particular, at least one end of a given component capacitor structure is disposed in one of four areas of an adjacent component capacitor structure. It is to be understood that the four areas of the adjacent component capacitor structure are substantially identical to areas 881, 882, 883, and 884 described above with reference to exemplary component capacitor structure 800 (FIG. 8).

In an example, the dimensions and orientation of the component capacitor structures are such that the packing density is maximized in an analogous fashion to that above-described with reference to FIG. 9.

To maximize the packing density, the dimensions adhere to the following specifications: (i) a first length of each of the top, bottom, left, and right ends of the component capacitor structures (i.e., a length analogous to first length 820 of component capacitor structure 800 or first length 920 of component capacitor structure 900) is substantially equal to the sum of the minimum metal width plus metal spacing; and (ii) a second length of each portion of the upright and transverse arms of each of the component capacitor structures that extends from the area of intersection of the upright and transverse arms (i.e., a length analogous to second length 810 of component capacitor structure 800 or second length 910 of component capacitor structure 900) is substantially equal to twice the first length.

As mentioned above, the alignment of the plurality of component capacitor structures can be such that the packing density is maximized. The alignment of the plurality of component capacitor structures that maximizes the packing density has been described above with reference to component capacitor structures 800 and 900, and its application to the component capacitor structures of FIG. 10 will be readily apparent to persons skilled in the art.

In addition to disposing a plurality of component capacitor structures on a single layer to form a capacitor, a plurality of component capacitor structures can be disposed on multiple layers of a substrate to form a capacitor. FIG. 11 shows a top view 1100 and a cross-sectional view 1150 of a multi-layer capacitor embodiment of the present invention. In the multi-layer configuration, a via 1130 is located at the center of each building block and used for electrode (high or low) connections. From the cross-sectional view 1150 it is clear that the capacitor structures of like bias on vertically adjacent layers 1151 and 1152 are electrically connected by via 1130.

To maximize the packing density of the multi-layer capacitor of FIG. 11, the dimensions and alignment of the component capacitor structures are substantially identical to the dimensions and alignment of the component capacitor structures that maximized the packing density of the single layer capacitor described with reference to FIG. 10.

Example Advantages

A component capacitor structure and/or capacitor in accordance with an embodiment of the present invention provide several advantages. A few of these example advantages are discussed below.

One advantage of a capacitor in accordance with an embodiment of the present invention is that it bypasses the requirement of minimum metal area. More specifically, there is a minimum metal island area requirement for photoresist, which is used to pattern the metal layer to stay on wafer during silicon processing. Insufficient metal island area will cause the photoresist to lift off and no metal pattern can be defined. Other capacitor designs do not necessarily meet the minimum metal requirement. However, due to its shape, a component capacitor structure and/or capacitor of the present invention always meets this requirement.

An additional advantage of a component capacitor structure and/or capacitor in accordance with an embodiment of the present invention is that it is less susceptible to process induced variations. To avoid process variations that can occur in today's CMOS interconnect processes, the local and global metal density must be maintained within prescribed limits—typically between 20 percent and 80 percent, with 50 percent being the ideal target for copper interconnect. In copper processes, if the metal density is above 80 percent, a concave metal profile (or "dishing") results; if the metal density is below 20 percent, a convex metal profile results.

In aluminum interconnect processes, it is important that the metal density be maintained within strict limits so that the end-point detection system signals the end of etching to prevent under- or over-etched metal. A capacitor in accordance with an embodiment of the present invention has a fixed metal density. In an embodiment, the metal density is 50 percent. The metal density of a capacitor in accordance with an embodiment of the present invention is the ratio of the minimum metal width (e.g., width 830 (FIG. 8) or width 930 (FIG. 9)) to the sum of the minimum metal spacing (e.g., width 980 or width 985) plus the minimum metal width.

Another advantage of a capacitor in accordance with an embodiment of the present invention is that it is less susceptible to process induced variation associated with chemical-mechanical polishing (CMP). The polishing action of CMP is circular, so capacitor designs that have uni-directional wires could incur a thickness variation along the two ends of the wire during CMP. These thickness variations can have detrimental effects on the capacitance matching, which is a very important parameter for analog designs. Smaller mismatch between adjacent capacitors on a chip results in a more efficient design and smaller silicon real estate used. A capacitor in accordance with embodiments of the present invention is fully symmetrical, which, due to the circular polishing action of CMP, offers the best CMP profile.

Figure 12:
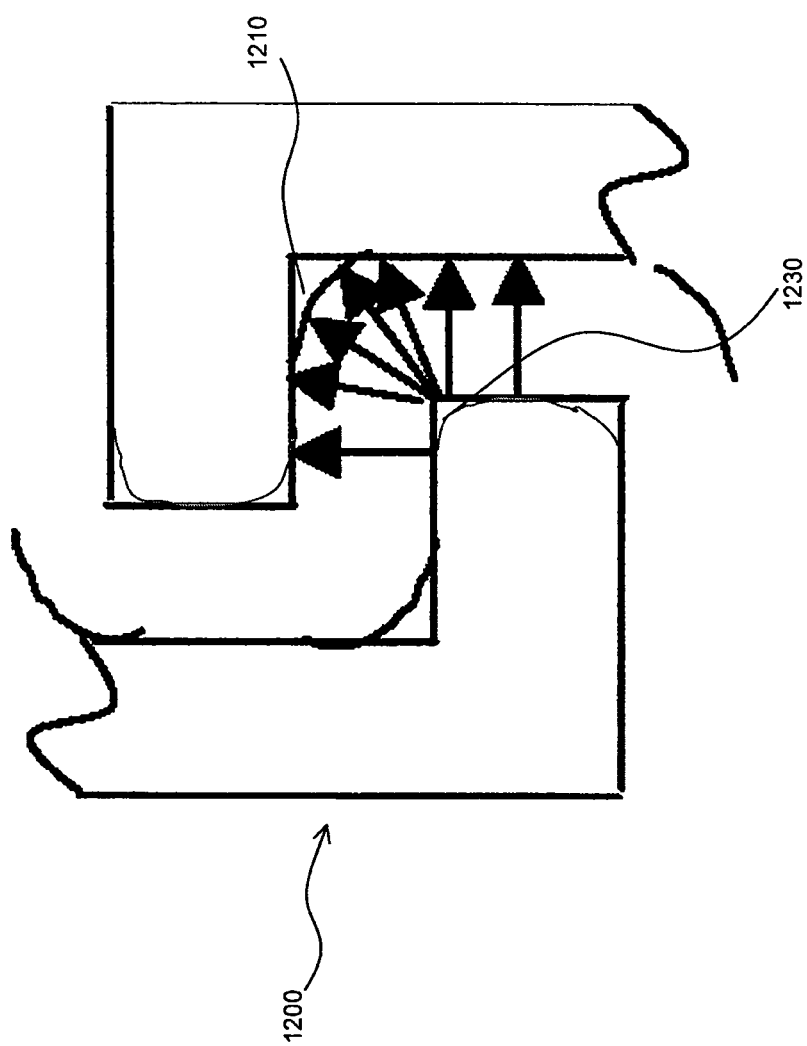
FIG. 12 illustrates a unit capacitance block of a capacitor in accordance with an embodiment of the present invention.

A further advantage of a component capacitor structure and/or capacitor in accordance with an embodiment of the present invention is that it takes full advantage of the rounding effect that occurs during the photoresist exposure stage. That is, during the photoresist exposure stage 90-degree corners are rounded due to the scattering of light. A capacitor in accordance with embodiments of the present invention utilizes this rounding to increase capacitance. For example, FIG. 12 shows a unit capacitance cell 1200 of a capacitor in accordance with an embodiment of the present invention. As the inner corner of the metal becomes rounded 1210, the metal finger 1230 also becomes rounded, thus forming a concentric half-circle. FIG. 12 shows that the capacitance is coming from a circular ring-like capacitor, where the electric flux is the most dense.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

In addition, it is to be appreciated that the Detailed Description section, and not the Summary and Abstract sections, is intended to be used to interpret the claims. The Summary and Abstract sections may set forth one or more but not all exemplary embodiments of the present invention as contemplated by the inventors, and thus, are not intended to limit the present invention and the appended claims in any way.

What is claimed is:

1. A capacitor comprising a first and second component capacitor structure disposed on a substrate, each component capacitor structure comprising:
   a first arm disposed on the substrate, the first arm having a first end and a second end;
   a second arm disposed on the substrate, the second arm having a third end and a fourth end, wherein the first arm and the second arm intersect, and wherein the first, second, third and fourth ends all extend in the same rotary direction; and
   a via electrically coupled to an area of intersection of the first and second arms.

2. The capacitor of claim 1, wherein the first and second component capacitor structures are disposed on the substrate such that
   the first end of the first arm of the first component capacitor structure is disposed in an area bounded by the second end of the first arm of the second component capacitor structure and the second arm of the second component capacitor structure.

3. The capacitor of claim 2, wherein each of the first and second arms of the first and second component capacitor structure has a substantially equal width.

4. The capacitor of claim 3, wherein each of the first, second, third, and fourth ends of the first and second component capacitor structures has a first length that is substantially equal to the sum of (i) the width of one of the first or second arms and (ii) the spacing between the first end of the first arm of the first component capacitor structure and the second arm of the second component capacitor structure.

5. The capacitor of claim 4, wherein each portion of the first and second arms extending from the area of intersection of the first and second arms has a second length that is substantially equal to two times the first length.

6. A capacitor comprising a plurality of component capacitor structures disposed on a substrate, each component capacitor structure comprising:
   a first arm disposed on the substrate, the first arm having a first end and a second end;
   a second arm disposed on the substrate, the second arm having a third end and a fourth end, wherein the first arm and the second arm intersect and wherein the first, second, third and fourth ends all extend in the same rotary direction; and
   a via electrically coupled to an area of intersection of the first and second arms.

7. The capacitor of claim 6, wherein the plurality of component capacitor structures are disposed on the substrate, each component capacitor structure of the plurality of component capacitor structures having at least one other component capacitor structure of the plurality of component capacitor structures disposed adjacent to it such that
   an end of one of the first arm and the second arm of each component capacitor structure in the plurality of component capacitor structures is disposed in an area bounded by one of
      the second end of the first arm of another component capacitor structure and the second arm of the other component capacitor structure,
      the first end of the first arm of another component capacitor structure and the second arm of the other component capacitor structure,
      the third end of the second arm of another component capacitor structure and the first arm of the other component capacitor structure, and
      the fourth end of the second arm of another component capacitor structure and the first arm of the other component capacitor structure.

8. The capacitor of claim 7, wherein a spacing between the first end of the first arm of a first component capacitor structure in the plurality of component capacitor structures and the second arm of a second component capacitor structure in the plurality of component capacitor structures is substantially equal to a spacing between the first end of the first arm of the first component capacitor structure and the second end of the first arm of the second component capacitor structure.

9. The capacitor of claim 8, wherein each of the first and second arms of the plurality of component capacitor structure has a substantially equal width.

10. The capacitor of claim 9, wherein each of the first, second, third, and fourth ends of the plurality of component capacitor structures has a first length that is substantially equal to the sum of (i) the width of one of the first or second arms and (ii) the spacing between the first end of the first arm of a given component capacitor structure and the second arm of a component capacitor structure adjacent to the given component capacitor structure.

11. The capacitor of claim 10, wherein each portion of the first and second arms extending from the area of intersection of the plurality of component capacitor structures has a second length that is substantially equal to two times the first length.

12. The capacitor of claim 11, wherein a spacing between the third end of the second arm of a first component capacitor structure in the plurality of component capacitor structures and the first arm of the at least one other component capacitor structure is substantially equal to a spacing between the third end of the second arm of the first component capacitor structure and the fourth end of the second arm of the at least one other component capacitor structure.

13. The capacitor of claim 6, wherein the plurality of component capacitor structures are disposed on a first layer of the substrate, further comprising:
   a second layer of the substrate vertically above the first layer, the second layer having a second plurality of component capacitor structures disposed thereon, wherein vertically adjacent component capacitor structures are electrically connected by their respective vias.

14. A method for operating a capacitor wherein the capacitor comprises two component capacitor structures, each component capacitor structure comprising a first arm disposed on a substrate, the first arm having a first end and a second end, a second arm disposed on the substrate, the second arm having a third end and a fourth end, wherein the first arm and the second arm intersect and wherein the first, second, third and fourth ends all extend in the same rotary direction, and a via electrically coupled to an area of intersection of the first and second arms, the method comprising:
   holding the via of the first component capacitor structure at a first voltage; and
   holding the via of the second component capacitor structure at a second voltage.

15. A method for operating a capacitor wherein the capacitor comprises a plurality of component capacitor structures, each component capacitor structure comprising a first arm disposed on a substrate, the first arm having a first end and a second end, a second arm disposed on the substrate, the second arm having a third end and a fourth end, wherein the first arm and the second arm intersect and wherein the first, second, third and fourth ends all extend in the same rotary direction, and a via electrically coupled to an area of intersection of the first and second arms, the method comprising:

holding the via of a first component capacitor structure in the plurality of component capacitor structures at a first voltage if the vias of component capacitor structures adjacent to the first component capacitor structure are held at a second voltage; and holding the via of a second component capacitor structure at a second voltage if the vias of the component capacitor structures adjacent to the second component capacitor structure are held at the first voltage.

\* \* \* \* \*